US007946860B2

(12) United States Patent
Suzuki et al.

(10) Patent No.: US 7,946,860 B2

(45) Date of Patent: May 24, 2011

(54) ELECTRIC JUNCTION BOX FOR A VEHICLE

(75) Inventors: Tatsuo Suzuki, Yokkaichi (JP); Tooru Nakagawa, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 65 days.

(21) Appl. No.: 11/950,107

(22) Filed: Dec. 4, 2007

(65) Prior Publication Data

US 2008/0153339 A1 Jun. 26, 2008

(30) Foreign Application Priority Data

Dec. 22, 2006 (JP) ................................ 2006-346325

(51) Int. Cl.
*H01R 12/00* (2006.01)
*H05K 1/00* (2006.01)

(52) U.S. Cl. ...................................... 439/76.2; 439/752

(58) Field of Classification Search ................. 439/76.2, 439/752, 595
See application file for complete search history.

(56) References Cited

U.S. PATENT DOCUMENTS

| | | | | |
|---|---|---|---|---|
| 5,000,693 A | | 3/1991 | Hatagishi et al. | |
| 6,139,375 A | * | 10/2000 | Konoya et al. | 439/752 |
| 6,386,904 B2 | * | 5/2002 | Sasaki et al. | 439/595 |
| 6,648,699 B1 | * | 11/2003 | Makino et al. | 439/752 |
| 6,712,623 B2 | | 3/2004 | Sumida | |
| 2006/0046536 A1 | | 3/2006 | Yomura | |
| 2006/0084294 A1 | | 4/2006 | Kita | |
| 2006/0131045 A1 | | 6/2006 | Okada | |

FOREIGN PATENT DOCUMENTS

| | | |
|---|---|---|
| JP | 2-285906 | 11/1990 |
| JP | 2000-231966 | 8/2000 |
| JP | 2001-37050 | 2/2001 |
| JP | 2002-291137 | 10/2002 |

OTHER PUBLICATIONS

English language Abstract of JP 2002-291137.
English language Abstract of JP 2-285906.
English language Abstract of JP 2001-37050.
English language Abstract of JP 2000-231966.

* cited by examiner

*Primary Examiner* — Felix O Figueroa
(74) *Attorney, Agent, or Firm* — Greenblum & Bernstein, P.L.C.

(57) ABSTRACT

An electric junction box for a vehicle is assembled by fitting and locking a connector through an aperture provided in a main case; the aperture being used for fitting the connector that holds a retainer at a temporary latch location, the retainer providing a double latch for a terminal; inserting and latching the terminal of an electric wire into the connector; and pushing the retainer into a full latch position. A recess for retainer operation is provided at a location facing the retainer and on a surrounding wall of the main case that surrounds the aperture.

6 Claims, 9 Drawing Sheets

ELECTRIC JUNCTION BOX FOR A VEHICLE

CROSS-REFERENCE TO RELATED APPLICATIONS

The present application claims priority under 35 U.S.C. §119 of Japanese Application No. 2006-346325, filed on Dec. 22, 2006, the disclosure of which is expressly incorporated by reference herein in its entirety.

BACKGROUND OF THE INVENTION

1. Field of the Invention

The present invention relates to an electric junction box for a vehicle, and more particularly, to an electric junction box in which a connector is inserted and latched through an aperture provided in a main case.

2. Description of Related Art

A conventional electric junction box for a vehicle includes a retainer for double latching terminals attached to a connector that is fitted into a connector receptacle of the electric junction box. For example, in an electric junction box disclosed in Japanese Patent Laid-Open Publication 2002-291137, as shown in FIG. 8A, a terminal receptacle 2 aligning numerous terminal chambers 2*a* is provided on an upper surface of an upper case 1. A retainer insertion slot 2*b* is provided at a side of the terminal receptacle 2 to receive insertion of a retainer 3 having a comb-like shape. The retainer 3 has insertion plates 3*b* aligned and projecting in parallel from a press plate 3*a*, and the insertion plates 3*b* are inserted into the terminal chambers 2*a*. Each insertion plate 3*b* has two latch projections 3*c*. As shown in FIG. 8B, each latch projection 3*c* latches a respective indentation 4*a* of a terminal 4 inserted into the terminal chamber 2*a*. Accordingly, through the use of the retainer 3 for double latching the terminals, it is possible to detect partial insertion of the terminals 4 inserted into the terminal chambers 2*a*, thereby improving the electrical connectivity between the external wires and internal circuit.

However, in Japanese Patent Laid-Open Publication H2-285906, as shown in FIG. 9, which discloses a through connector 6 fitted and latched with an aperture 5 of a case, it is preferable that terminals of the wire terminals inserted into the through connector 6 are double latched, since the terminals in the through connector 6 are pressed with a load when a mating connector 7 is fitted from above. However, the JP H2-285906 device does not provide the double latch mechanism for the terminals in the through connector 6. This is because a retainer cannot be easily attached to the through connector 6 to be fitted with the aperture 5 of the case, since the outer perimeter of the connector is surrounded by an internal perimeter surface of the aperture 5.

In other words, when the retainer for the double latch is to be attached to the through connector 6, as shown in FIGS. 10A and 10B, the through connector 6 is moved downward and assembled into the aperture 5. Thus, wires W need to be inserted through the aperture 5 so as to insert and latch terminals t, which are connected to the upper ends of the wires, with the through connector 6 in an upper location. Therefore, an excess length of wires is created, which is longer than the length of wires required when the through connector 6 is attached to a normal position within the aperture 5. Further, after the retainer 8, which double latches the terminals t inserted and latched within the through connector 6, is attached to the aperture 5, the retainer insertion slot is surrounded by the internal surface of the aperture 5, thereby preventing the insertion of the retainer. Therefore, the retainer 8 is inserted into and latched with the through connector 6, and while retaining the double latch state, the through connector 6 is attached within the aperture 5. Thus, when there is erroneous connection of terminals in the through connector 6 attached within the aperture 5, it is impossible to remove the retainer to correct the erroneous connection.

SUMMARY OF THE INVENTION

The present invention is provided to address the above-described problems. A purpose of the invention is to provide an electric junction box for a vehicle in which terminals of wires are inserted into a connector that is fitted in a through hole of a case, and in which a retainer for double latching can be attached and easily removed.

An aspect of the present invention provides an electric junction box for a vehicle including a connector fitted through an aperture provided within a main case, the aperture receiving the connector that holds a retainer at a temporary latch location, the retainer providing a double latch for a terminal, a recess for retainer operation provided at a location facing the retainer and on a surrounding wall of the main case that surrounds the aperture; a lock provided on an outer surface of the connector joined with a lock portion provided on an inner surface of the aperture; the terminal of an electric wire inserted and latched into the connector; and the retainer pushed into a full latch position. Further, the connector is fitted from above into the aperture of the main case and is attached in a horizontal orientation; the retainer for the connector is provided with a plurality of latching teeth having a comb shape that are inserted into respective terminal chambers of the connector between side walls projecting from ends of a press plate; each tip of the side walls is provided with a temporary latch finger and a full latch finger, the temporary latch finger and the full latch finger located facing mutually opposing directions; the temporary latching position of the retainer includes the temporary latch finger latched at a shallow insertion position, with a temporary latch projection provided within the connector, thereby providing a partial fitting state allowing insertion of the terminal, while restricting withdrawal of the retainer; and the fully latched position of the retainer includes the press plate of the retainer pushed in until the plate is aligned with an external surface of a connector housing, and the full latch finger is latched with a full latch projection provided at a deeper end within the connector, while preventing withdrawal of the terminal. In a further aspect of the present invention, the electric junction box includes a pair of release pieces projecting from a bottom end of the press plate of the retainer, the pieces and the press plate aligned with the connector housing at the full latch position, and grooves provided on an outer surface of the housing at a location corresponding to tips of the release pieces; a bottom surface of the recess for retainer operation is located at a bottom surface of the press plate of the retainer at the full latch position; and an inner end of the recess for retainer operation facing the release piece of the retainer provided with a notch extending and opening downward, the notch receiving a release jig, to release the retainer from the full latch position when the release jig is inserted from a lower end of the notch. Further, the electric junction box for a vehicle may include a corner of the outer surface of the connector housing provided with a rib projecting and extending the vertical length of the housing, and a bottom surface of the rib contacting an upper surface of the surrounding wall of the aperture to fit the connector, so that the rib can receive a load when a mating connector is fitted with the connector from above. The electric junction box for a vehicle may include a connector that is a multi-polar connector, and three locks provided between the outer surface of the connector housing and the inner surface of the aperture.

A further aspect of the present invention provides an electric junction box for a vehicle including fitting a connector through an aperture provided within a main case, the aperture receiving the connector that holds a retainer at a temporary latch location, the retainer providing a double latch for a terminal, a recess for retainer operation provided at a location facing the retainer and on a surrounding wall of the main case that surrounds the aperture; joining a lock provided on an outer surface of the connector with a lock portion provided on an inner surface of the aperture; inserting and latching a terminal of an electric wire into the connector while retaining the retainer in the temporary latch location; and pushing the retainer into a full latch position. Further, the method of assembling an electric junction box for a vehicle may include fitting the connector from above into the aperture of the main case and attaching the connector in a horizontal orientation; providing the retainer with a plurality of latching teeth having a comb shape that are inserted into respective terminal chambers of the connector, the latching teeth positioned between side walls projecting from ends of a press plate; providing each tip of each of the side walls with a temporary latch finger and a full latch finger, the temporary latch finger and the full latch finger located facing mutually opposing directions; temporarily latching the retainer, including latching the temporary latch finger at a shallow insertion position with a temporary latch projection provided within the connector, thereby providing a partial fitting condition that allows insertion of the terminal, while restricting withdrawal of the retainer; and fully latching the retainer, including pushing in the press plate of the retainer until the press plate is aligned with an external surface of a connector housing, and the full latch finger is latched with a full latch projection provided at a deeper end within the connector, while preventing withdrawal of the terminal.

Further, the method of assembling an electric junction box for a vehicle may include providing a pair of release pieces projecting from a bottom end of the press plate of the retainer, the release pieces and the press plate being aligned with the connector housing at the full latch position, and providing grooves on an outer surface of the housing at a location corresponding to tips of the release pieces; providing a bottom surface of the recess for retainer operation located at a bottom surface of the press plate of the retainer at the full latch position; and providing an inner end of the recess for retainer operation facing the release piece of the retainer with a notch that extends and opens downward, the notch receiving a release jig, to release the retainer from the full latch position when the release jig is inserted from a lower end of the notch. A further aspect of the present invention may include providing a corner of the outer surface of the connector housing with a rib that projects and extends the vertical length of the housing, while a bottom surface of the rib contacts an upper surface of the surrounding wall of the aperture to fit the connector, so that the rib can receive a load when a mating connector is fitted with the connector from above. Further, the connector may be a multi-polar large connector, and three locks may be provided between the outer surface of the connector housing and the inner surface of the aperture.

By having the configuration of the present invention, the retainer can be pushed in by a finger from the recess for retainer operation provided in the main case, even after the connector has been fitted into the aperture. Therefore, the retainer can be moved from the temporary latch position that allows terminal insertion, to the full latch position that restricts withdrawal of the terminals. Accordingly, there is no need to take the conventionally required step of inserting and latching the terminals of the electrical wire into the connector, prior to fitting the connector into the aperture. In the present invention, after fitting the connector into the aperture, the terminals of the electrical wire are inserted and latched, and then the retainer is pushed in. Therefore, there is no need to have an excess length of the electrical wire, thereby lowering the material cost. Further, there is no need to use a special jig for pushing in the retainer. In addition, wire insertion into the aperture is not needed. Therefore, it is possible to improve the assembly operation. Especially when the connector is a multi-polar connector, insertion of a plurality of wires may be challenging. Therefore, it is possible to largely reduce the workload. Furthermore, the connector can be fitted into the aperture while temporarily latching the retainer. Therefore, it is possible to prevent loss of the retainer, improve operation, and reduce assembly time.

With the above described construction to release the retainer from the full latch position, it is possible to reconnect the wires when erroneous wiring is found after fitting the connector, by moving the retainer from the full latch position to the temporary latch position while the connector is still fitted, without undergoing the trouble of removing the connector from the main case.

It is preferable that a corner of the outer surface of the connector housing is provided with a rib that projects and extends the entire vertical length of the housing, while a bottom surface of the rib contacts the upper surface of the surrounding wall of the aperture for fitting the connector, so that the rib can receive a load when a mating connector is fitted with the connector from above. Accordingly, it is possible to increase the strength of the connector and the main case against the load, thereby preventing breakage during the assembly.

It is possible to disperse the load applied on the locks, when the mating connector is fitted or removed, thereby increasing the strength while improving retention and preventing instability of the connector. Additionally, it is preferable that the three locks are provided at asymmetric locations, in order to prevent erroneous connection.

As described above, according to the present invention, the electric wire terminals can be inserted and latched into the connector and the retainer can be pushed into the full latch position, even after the connector has been fitted with the main case. Accordingly, there is no need to take the conventionally required step of inserting and latching the electrical wire into the through hole to connect to the connector, prior to fitting the connector into the through hole. Therefore, there is no need to have an excess length of the electrical wire, thereby lowering the material cost. In addition, wire insertion into the through hole is no longer needed, thereby improving the workability. Further, by having the recess for retainer operation provided on the surrounding wall of the main case, the retainer is easily pushed, by a finger, into the connector that is fitted with the main case. Thus, there is no need to use a conventionally required special jig for pushing in the retainer, thereby also improving the operation.

In addition, by having the notch on the bottom surface of the recess for retainer operation, the structure allows the jig for releasing the fully latched retainer to be inserted into the notch. Therefore, it is possible to reconnect the wires when erroneous wiring is found after fitting the connector, by easily releasing the retainer from the full latch position while the connector is still fitted, without removing the connector from the main case.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
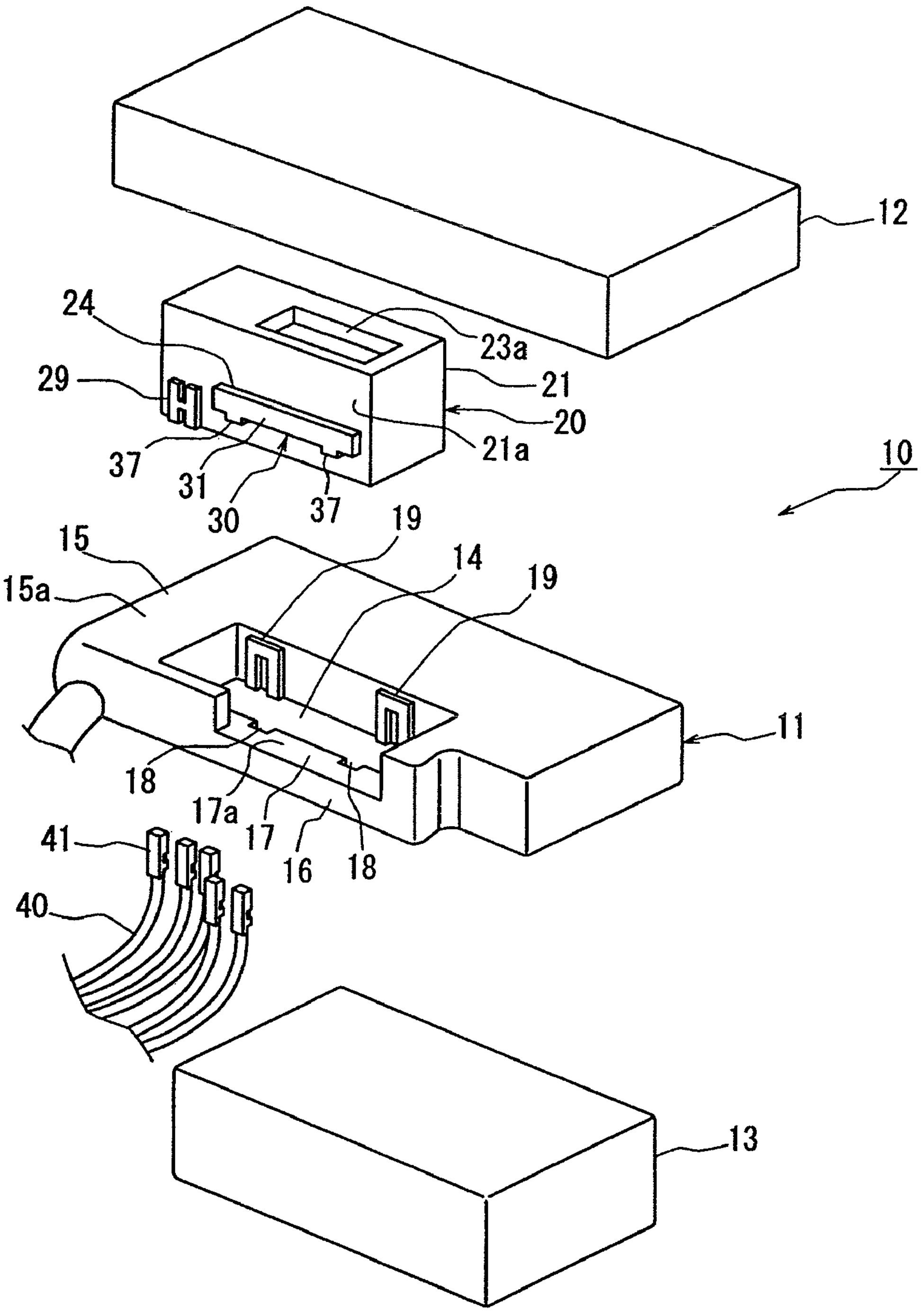
FIG. 1 is a schematic exploded perspective view of an electric junction box according to an embodiment of the present invention.

The embodiments of the present invention are explained with reference to FIGS. 1-7. FIG. 1 illustrates an electric junction box 10 for a vehicle according to the present invention. The electric junction box includes a main case 11, an upper case 12 that fits on an upper surface of the main case 11, and a lower case 13 that fits on a bottom surface of the main case 11. In the main case 11, an aperture 14 for receiving a connector is provided. The aperture 14 is bounded by an exterior surrounding wall 16 on a portion of one side. A connector 20 is fitted into the aperture 14 for attachment in a horizontal orientation while a retainer 30 is attached to the connector 20 in order to double latch the wire terminals. The connector 20 is a through connector that fits and connects terminal ends that are connected to a wire harness terminal.

Figure 2A:
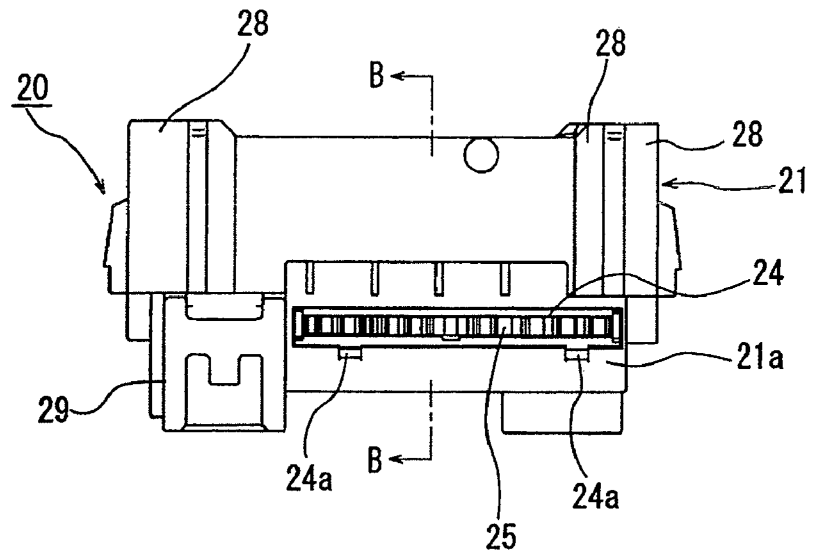
FIG. 2A illustrates a front view of a connector housing of the embodiment of FIG. 1.
Figure 2B:
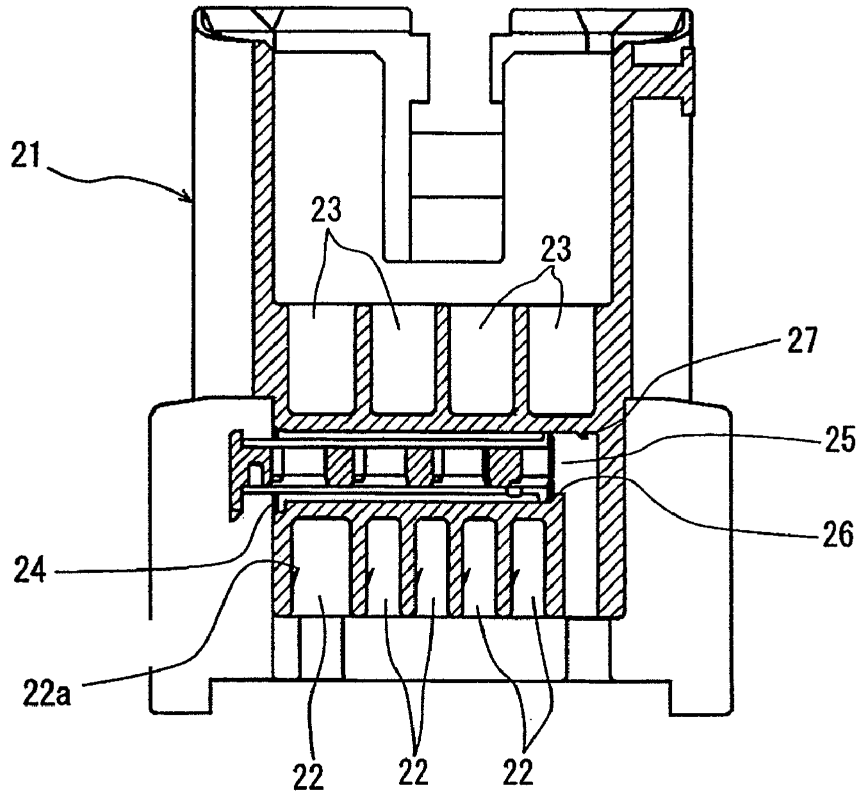
FIG. 2B illustrates a cross sectional view, taken along the line B-B in FIG. 2A, of the connector housing of the embodiment of FIG. 1 showing the connector housing with a retainer attached thereto.

As shown in FIG. 2B, the connector 20 is configured with a plurality of terminal chambers 22 and 23 at respective lower and upper sides of a housing 21. The housing 21 may be formed of any suitable material such as, for example, a synthetic resin. The terminal chambers 22 can house terminals 41 of wires 40 inserted from a lower side, while the terminal chambers 23 house mating connector terminals (not shown in the drawing) to be fitted from an upper side. As shown in FIG. 2B, in a central region of the inner wall of each terminal chamber 22, a lance 22*a* projects from the inner wall. The lance 22*a* is to be primarily latched with a latch portion of the terminal 41.

One of the exterior walls of the housing 21 includes, as shown in FIG. 2A, a retainer insertion slot 24 and a cavity 25 that is recessed inwardly in order to have an orthogonal insertion and connection direction with respect to the terminal insertion direction of the terminal chamber 22. When inserting the retainer 30 into the cavity 25, a latch convex portion 36 of the retainer 30 latches with a latch indentation 41*b* of the terminal 41, as shown in FIG. 5B, thereby providing a secondary latch for the terminal 41. Accordingly, through the primary latch by the lance 22*a* and the secondary latch by the retainer 30, the terminal 41 is double latched and prevented from falling out.

Figure 3A:
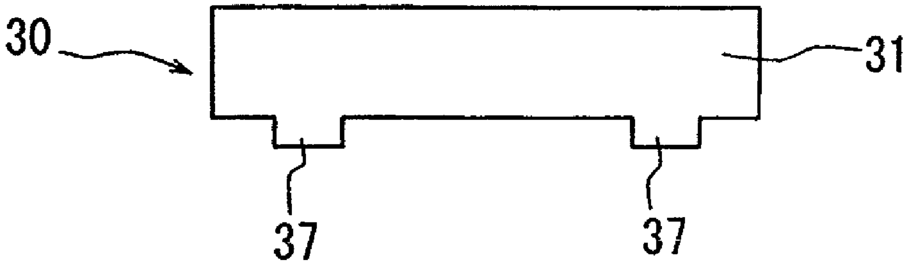
FIG. 3A illustrates a front view of the retainer of the embodiment of FIG. 1.
Figure 3B:
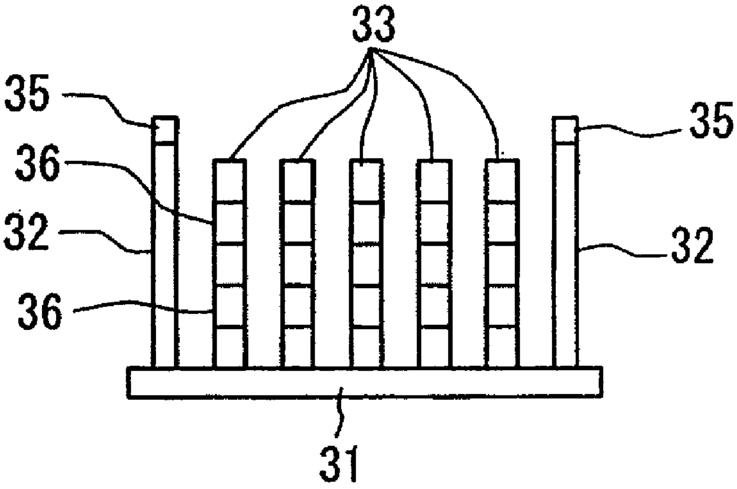
FIG. 3B illustrates a plan view of the retainer of the embodiment of FIG. 1.
Figure 3C:
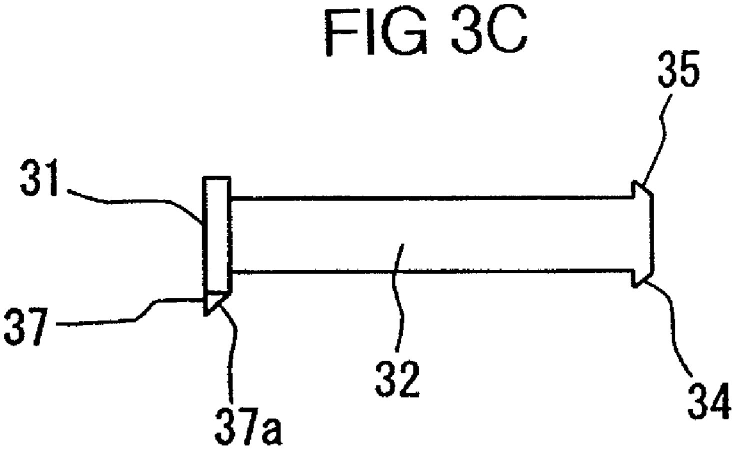
FIG. 3C illustrates a side view of the retainer of the embodiment of FIG. 1.

As shown in FIGS. 3A-3C, the retainer 30 has a U-shaped frame and both side walls 32 project from both ends of the press plate 31. A plurality of latch pieces 33 are provided in a comb-like structure, so as to be inserted in the respective terminal chambers 22 of the housing 21. Each tip of the both side walls 32 is provided with mutually opposing temporary latch finger 34 and full latch finger 35 projecting from both ends in a vertical width direction of the both side walls 32. A pair of release pieces 37 are provided in a downward direction on a lower end of the press plate 31. An outer surface of a lower end of the release piece 37 is flat, while the inner surface has a tapered surface 37*a*.

As shown in FIG. 2B, the upper and lower sides of the inner walls of the cavity 25 of the housing 21 are provided with a temporary latch projection 26 and a full latch projection 27 having different locations in the depth direction, so as to latch the retainer 30 at the temporary and full latch positions. In particular, on the further end of the upper wall inner surface of the cavity 25, the full latch projection 27 is provided to face the full latch finger 35 of the retainer 30, which is inserted into the cavity 25. On the bottom wall inner surface of the cavity 25, at a location closer to the cavity entrance than that of the full latch projection 27, the temporary latch projection 26 is provided to face the temporary latch finger 34 of the retainer 30.

Figure 4A:
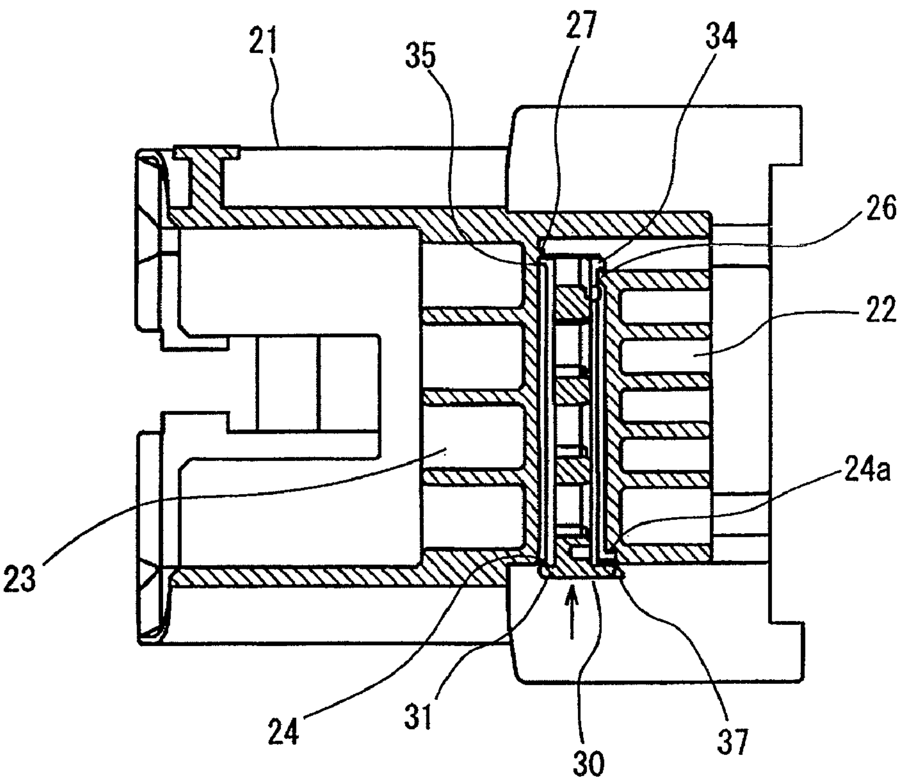
FIG. 4A illustrates a cross sectional view of a main portion of the retainer of the embodiment of FIG. 1 in a temporarily latched position.
Figure 4B:
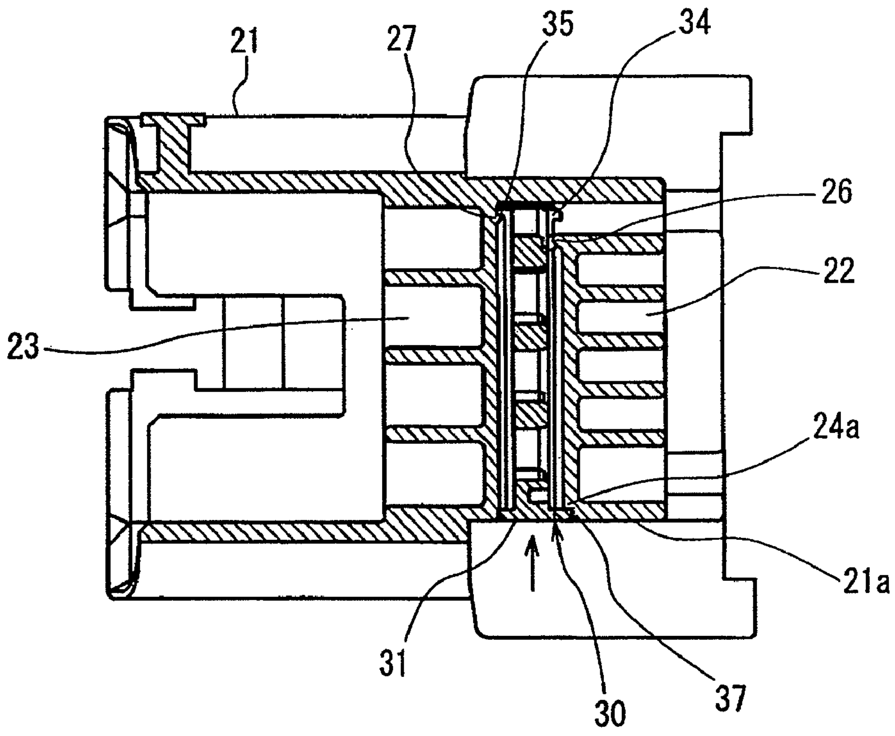
FIG. 4B illustrates a cross sectional view of a main portion of the retainer of the embodiment of FIG. 1 in a fully latched position.

When the retainer 30 is temporarily latched, the latch teeth 33 of the retainer 30 are inserted into the cavity 25 from the retainer insertion slot 24 of the housing 21. As shown in FIGS. 4A and 4B, the temporary latch finger 34 latches against the temporary latch projection 26, thereby restricting movement in the direction of pulling the retainer 30 out of the insertion slot 24. At the same time, the full latch finger 35 contacts a front surface of the full latch projection 27 of the housing 21, thereby restricting movement in the direction of pushing the retainer 30 further into the insertion slot 24.

When the retainer 30 is to be fully latched, the press plate 31 of the retainer 30 is pushed in until the plate is level with a peripheral exterior surface 21*a* of the housing 21. Therefore, the temporary latch finger 34 moves over the temporary latch projection 26 to release the temporary latch, and the full latch finger 35 latches against the full latch projection 27, thereby restricting movement of the retainer 30 in the direction of pulling the retainer 30 out of the insertion slot 24.

When the retainer 30 is pushed into the full latch position, the retainer insertion slot 24 of the housing 21 is closed by the press plate 31. Further, the release pieces 37 of the retainer 30 are contained within grooves 24*a* recessed in a bottom end frame of the retainer insertion slot 24 of the housing 21. Therefore, the release pieces 37 are level with the peripheral exterior surface 21*a* of the housing 21.

Figure 5A:
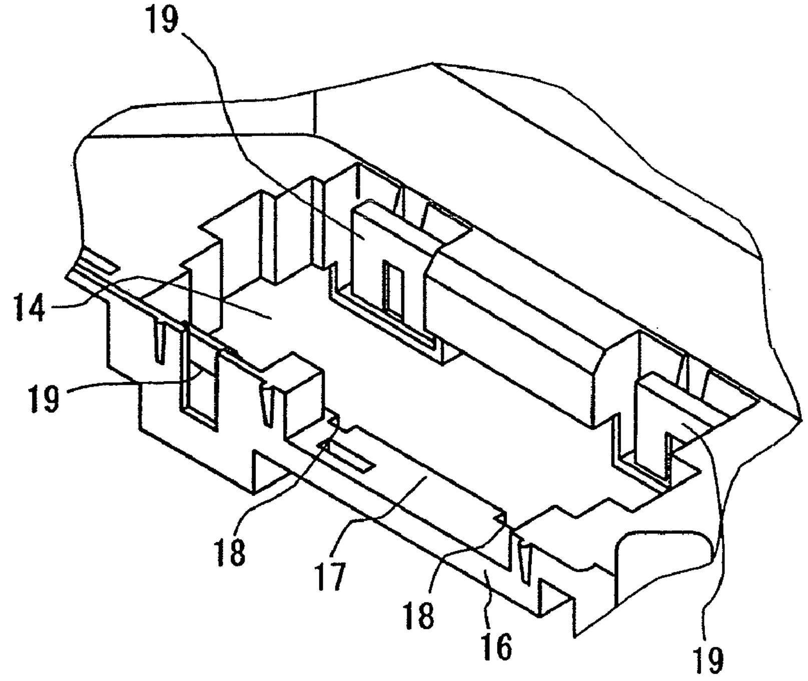
FIG. 5 A is a partial perspective view of a main case of the embodiment of FIG. 1 illustrating an aperture for fitting a connector.
FIG. 5B is a partial perspective view of a main case of the embodiment of FIG. 1 illustrating the connector fitted into the aperture.
Figure 5B:
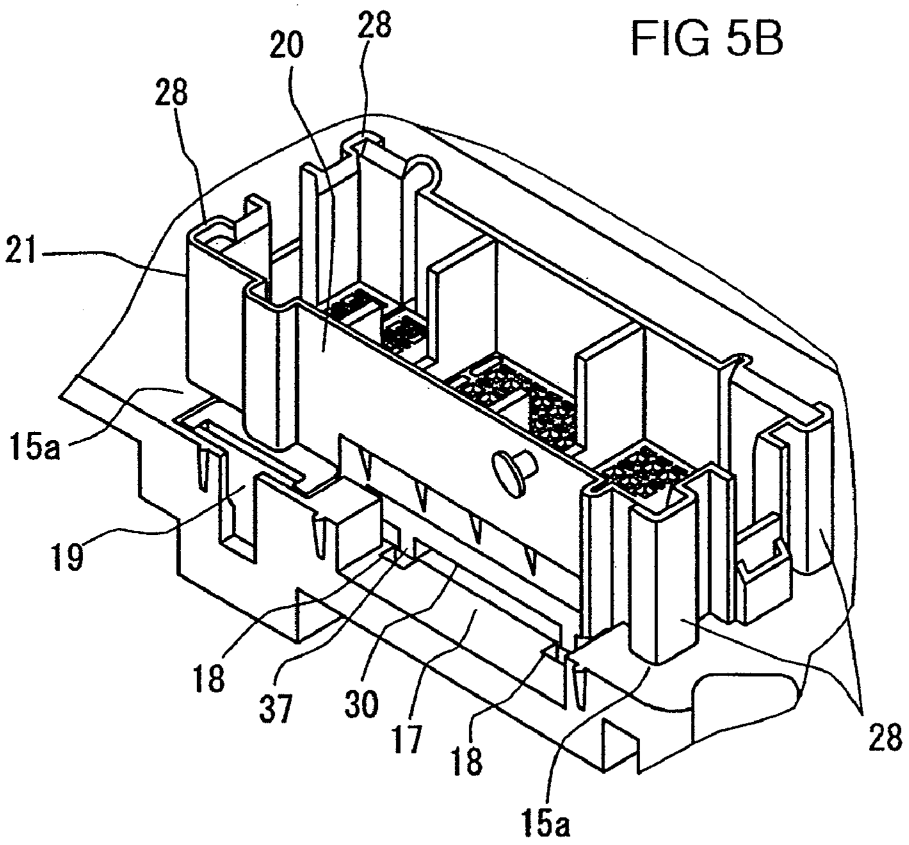

As shown in FIGS. 1, 5A, and 5B, the exterior surrounding wall 16 that surrounds the aperture 14 of the main case 11 is provided with a recess for retainer operation 17 from the top surface at a location facing the press plate 31 of the retainer 30, the recess for retainer operation 17 extending and opening in the inward and outward directions. A bottom surface 17*a* of the recess for retainer operation 17 is at the same height as a lower end surface of the press plate 31 of the retainer 30. Notches 18 extend and open in a vertical direction at an inner side of the bottom surface 17*a*, at a location facing the pair of release pieces 37 of the retainer 30.

In addition, as shown in FIG. 5B, each corner of the peripheral exterior surface 21*a* of the housing 21 of the connector 20 is provided with a rib 28 that projects outwardly from the inner surface of the aperture 14 and extends to an entire vertical length of the housing 21. The bottom end surface of the rib 28 contacts an upper surface 15*a* of the surrounding wall 15 that surrounds four sides of the aperture 14 of the main case 11.

Figure 6A:
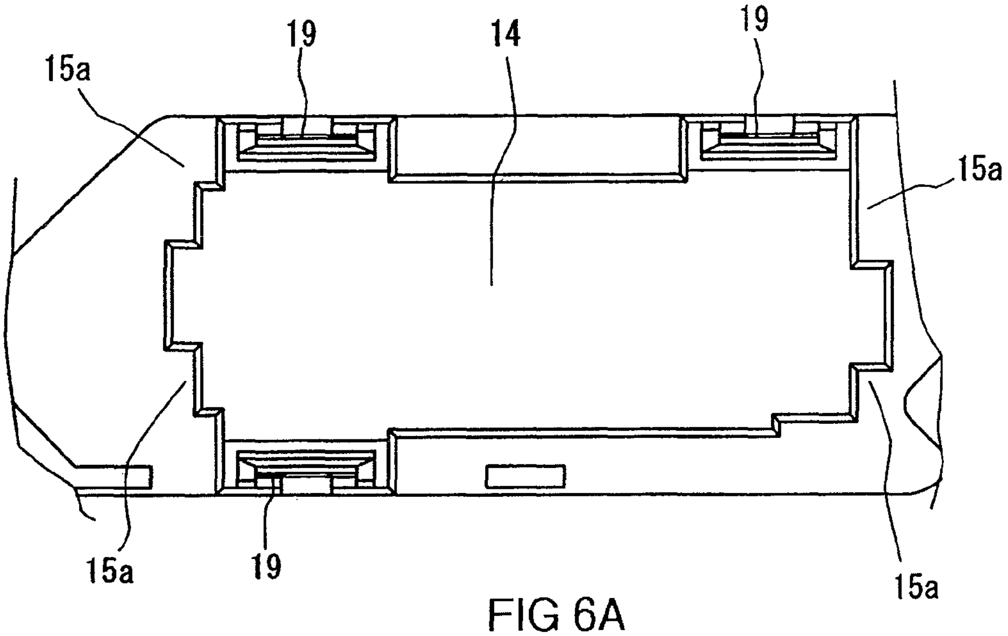
FIG. 6A is a plan view illustrating a surrounding wall of the aperture in the main case of the embodiment of FIG. 1 illustrating locking locations of the main case and the connector.
Figure 6B:
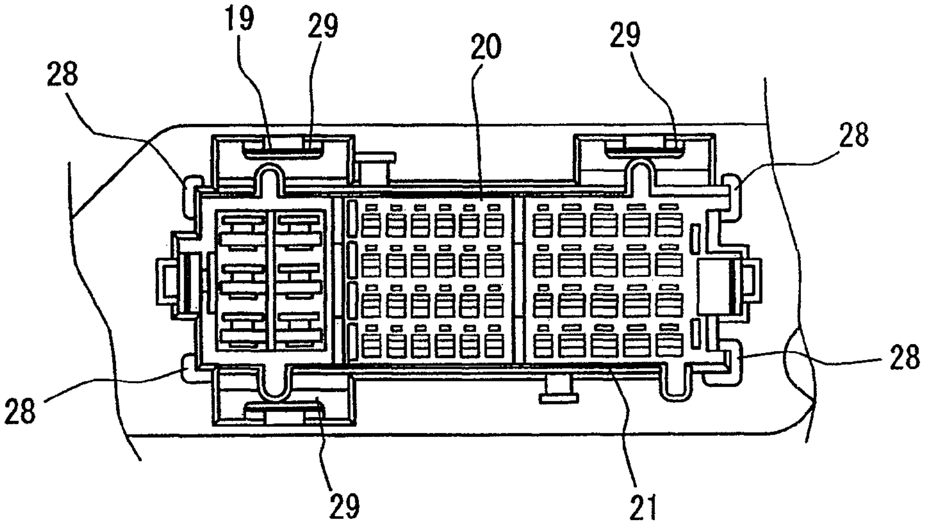
FIG. 6B is a plan view illustrating a surrounding wall of the aperture in the main case of the embodiment of FIG. 1 illustrating the connector fitted into the aperture.

Further, as shown in FIGS. 6A and 6B, the peripheral exterior surface 21*a* of the housing 21 of the connector 20 is provided with three locks 29 at asymmetric locations. Locking portions 19 that face the locks 29 are provided on the inner surface of the aperture 14 of the main case 11.

The following describes a retainer attaching process of the electric junction box 10 having the above described configuration. First, the retainer 30 is inserted into the cavity 25, from the retainer insertion slot 24 of the housing 21 of the connector 20. Then, the retainer 30 is latched and held at the temporary latch position. While maintaining the temporary latch of the retainer, the connector 20 is fitted, from above, into the aperture 14 of the main case 11, and the locks 29 of the connector 20 are locked and joined with the locking portions 19 of the main case 11.

Next, terminals 41 of the wires 40 are inserted, from the bottom surface opening, into each of terminal chambers 22 of the connector 20, which is fitted with the aperture 14. The terminals 41 are inserted into each of terminal chambers 22 and primarily latched with lances 22*a*. Finally, the press plate 31 of the retainer 30 is pushed by the operator's finger from the recess for retainer operation 17 of the main case 11, thereby the retainer 30 is pushed into the full latch position and secondarily latched.

In the electric junction box 10 having the above-described configuration, the connector 20 is first fitted into the aperture 14, the terminals 41 of the wires 40 are inserted into and latched with the connector 20, and then the retainer 30 is pushed into the full latch position. Therefore, there is no need to connect the wires 40 with the connector 20 through the aperture 14 prior to fitting the connector 20, which is required in prior art electric junction boxes. Therefore, there is no need to provide the wires 40 with an excess length, thereby reducing the material cost. Further, the wires do not need to be inserted through the aperture 14, and a special jig for pushing in the retainer 30 is not needed. Therefore, it is possible to improve the productivity and operation of the device and its assembly.

Figure 7:
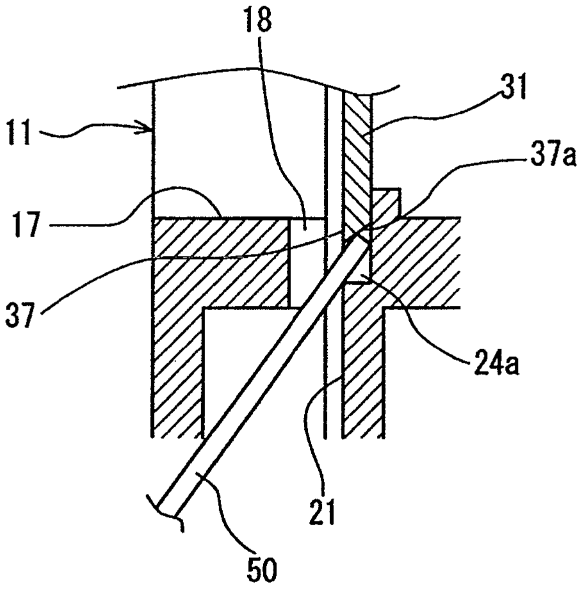
FIG. 7 is a cross sectional view illustrating use of a retainer removal jig.
Figure 8A:
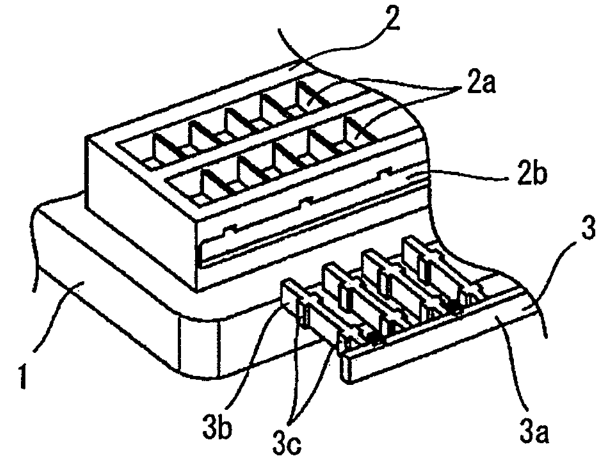
FIG 8A PRIOR ART
FIGS. 8A and B illustrate a prior art electric junction box.
Figure 8B:
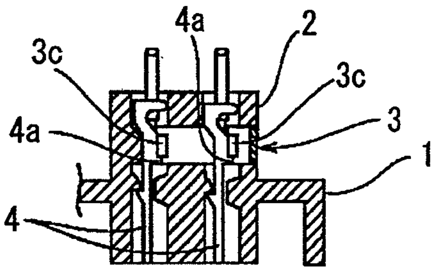
FIG 8B PRIOR ART
Figure 9:
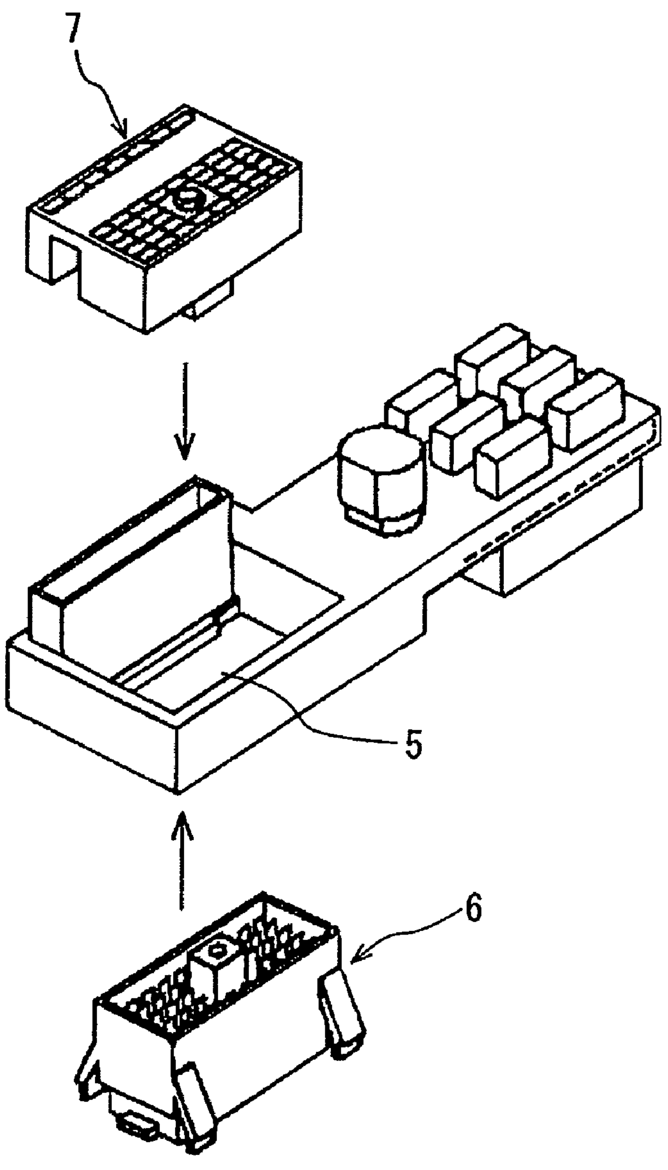
FIG 9 PRIOR ART
FIG. 9 illustrates another prior art electric junction box.
Figure 10A:
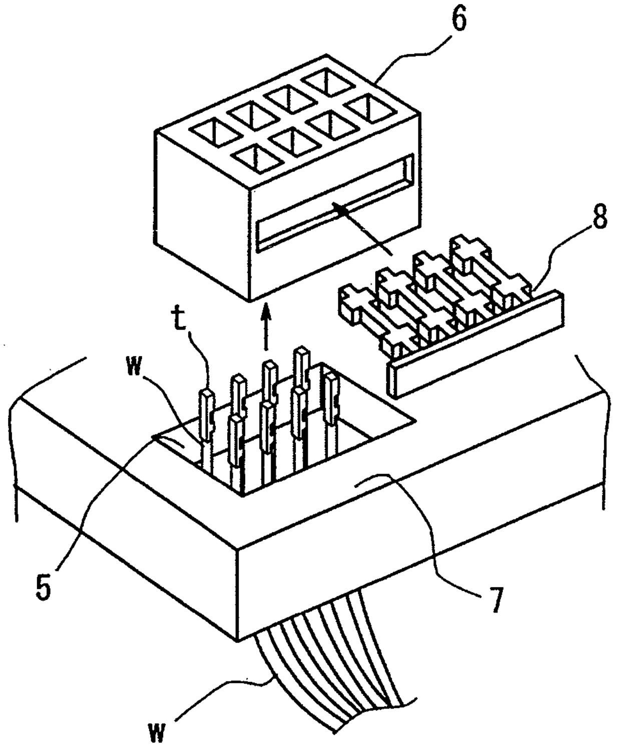
FIG 10A PRIOR ART
FIGS. 10A and B illustrate problems developed when a retainer is attached to a conventional through connector.
Figure 10B:
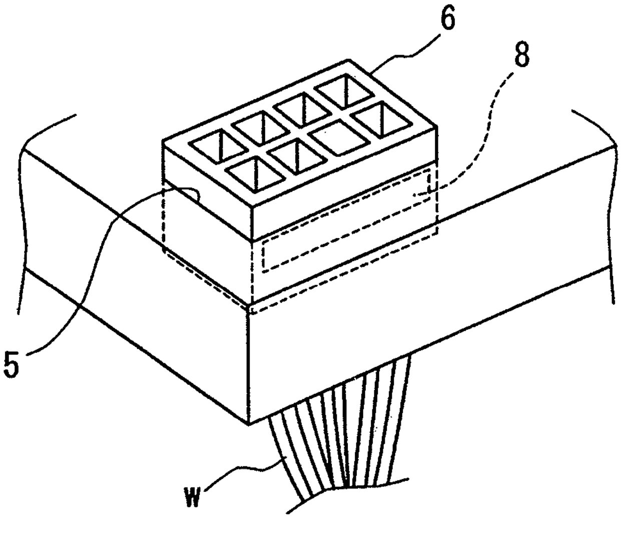
FIG 10B PRIOR ART

In addition, when the connector is already fitted with the aperture 14 and erroneous connection of the wires 40 are found, there is no need to undergo the difficulty of removing the connector 20 from the main case 11. Instead, as shown in FIG. 7, a removal jig 50 can be inserted, from the bottom, into the notch 18 provided at the bottom surface of the recess for retainer operation 17, so that the tip of the removal jig 50 is inserted in a gap provided at the bottom end of the groove 24*a* of the connector housing 21. Then, the tip of the removal jig 50 is contacted with the tapered surface 37*a* of the release piece 37 of the retainer 30 to hook the release piece 37 and to pull it forward in order to move the retainer 30 from the full latch position to the temporary latch position. Therefore, it is possible to reconnect the wires 40 while the connector 20 is fitted with the main case 11.

Further, when a mating connector (not shown in the drawing) is fitted from above in relation to the connector 20 attached to the aperture 14 of the main case 11, the bottom end surfaces of the ribs 28 projecting from the outer surface of the connector housing 21 contact the top surface 15*a* of the surrounding wall 15 of the main case 11, thereby functioning as load bearers and dispersing the load. Therefore, it is possible to prevent breakage of the main case 11 and connector 20 caused by a strong force when fitting the connectors.

Furthermore, since there are three locking connection positions between the connector 20 and the main case 11, it is possible to improve retention and strength of the connector 20 when the mating connector is removed, thereby preventing instability of the connector 20. In addition, since the three locking connection positions are provided at asymmetric positions, it is possible to prevent erroneous fitting of the connector 20.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box for a vehicle, comprising:

a connector fitted through an aperture provided within a main case, the aperture receiving the connector that holds a retainer at a temporary latch location, the retainer providing a double latch for a terminal, a recess for a retainer operation provided at a location facing the retainer and on a surrounding wall of the main case that surrounds the aperture;

a lock provided on an outer surface of the connector joined with a lock portion provided on an inner surface of the aperture;

the terminal of an electric wire inserted and latched into the connector; and the retainer pushed into a full latch position, wherein a portion of a surrounding wall that defines the aperture and facing the retainer is shorter than remaining portions of the surrounding wall on either side of said portion to define said recess for the retainer operation, the retainer abutting against the shorter portion of the surrounding wall, and wherein the shorter portion of the surrounding wall includes notches that receive release pieces of the retainer, the release pieces being provided at defined positions along a length of a press plate of the retainer.

2. The electric junction box for a vehicle according to claim 1, wherein:

the connector is fitted from above into the aperture of the main case and is attached in a horizontal orientation;

the retainer for the connector is provided with a plurality of latching teeth having a comb shape that are inserted into respective terminal chambers of the connector between side walls projecting from ends of a press plate;

each tip of the side walls is provided with a temporary latch finger and a full latch finger, the temporary latch finger and the full latch finger located facing mutually opposing directions;

the temporary latching position of the retainer includes the temporary latch finger latched at a shallow insertion position, with a temporary latch projection provided within the connector, thereby providing a partial fitting state allowing insertion of the terminal, while restricting withdrawal of the retainer; and the fully latched position of the retainer includes the press plate of the retainer pushed in until the plate is aligned with an external surface of a connector housing, and the full latch finger is latched with a full latch projection provided at a deeper end within the connector, while preventing withdrawal of the terminal.

3. The electric junction box for a vehicle according to claim 1, further comprising:

the release pieces projecting from a bottom end of the press plate of the retainer, the release pieces and the press plate being aligned with the connector housing at the full latch position, and grooves provided on an outer surface of the housing at a location corresponding to tips of the release pieces;

a bottom surface of the recess for retainer operation is located at a bottom surface of the press plate of the retainer at the full latch position; and an inner end of the recess for retainer operation facing the release piece of the retainer provided with a notch extending and opening downward, the notch receiving a release jig, to release the retainer from the full latch position when the release jig is inserted from a lower end of the notch.

4. The electric junction box for a vehicle according to claim 1, further comprising:

a corner of the outer surface of the connector housing provided with a rib projecting and extending the vertical length of the housing, and a bottom surface of the rib contacting an upper surface of the surrounding wall of the aperture to fit the connector, so that the rib can receive a load when a mating connector is fitted with the connector from above.

5. The electric junction box for a vehicle according to claim 1, further comprising:

the connector is a multi-polar connector, and three locks provided between the outer surface of the connector housing and the inner surface of the aperture.

6. The electric junction box for a vehicle according to claim 1, wherein a length of the shorter portion of the surrounding wall corresponds to a length of a retainer press plate.

* * * * *